(12) United States Patent
Lye

(10) Patent No.: US 7,986,190 B1
(45) Date of Patent: Jul. 26, 2011

(54) JITTER ATTENUATION WITH A FRACTIONAL-N CLOCK SYNTHESIZER

(75) Inventor: William Michael Lye, Coquitlam (CA)

(73) Assignee: PMC-Sierra, Inc., Santa Clara, CA (US)

( * ) Notice: Subject to any disclaimer, the term of this patent is extended or adjusted under 35 U.S.C. 154(b) by 83 days.

(21) Appl. No.: 12/610,074

(22) Filed: Oct. 30, 2009

(51) Int. Cl.
*H03L 7/18* (2006.01)

(52) U.S. Cl. .......................... 331/1 A; 331/16; 375/376

(58) Field of Classification Search ............. 331/1 A, 331/16–18, 23, 25; 327/156–159; 329/325; 332/127; 360/51; 375/376; 455/260
See application file for complete search history.

(56) References Cited

U.S. PATENT DOCUMENTS

| | | | |
|---|---|---|---|
| 5,038,117 A | 8/1991 | Miller | |
| 6,993,306 B2 | 1/2006 | Buznitsky et al. | |
| 7,106,244 B2 | 9/2006 | Hsu | |
| 7,158,596 B2 | 1/2007 | Knapp et al. | |
| 7,253,842 B2 | 8/2007 | Louie et al. | |
| 7,272,202 B2 | 9/2007 | Knapp et al. | |
| 7,339,628 B2 | 3/2008 | Gudmondson et al. | |
| 7,558,358 B1 * | 7/2009 | Melanson | 375/376 |

* cited by examiner

*Primary Examiner* — David Mis

(74) *Attorney, Agent, or Firm* — Knobbe Martens Olson & Bear LLP

(57) ABSTRACT

A circuit, such as, but not limited to, a digital phase-locked loop (PLL) or a transport timing loop, uses a fractional-N modulator and a fractional-N clock synthesizer to generate a clock signal, such as a transmit clock signal, from a reference clock signal. One embodiment uses a recovered clock signal derived from serial received data as a positive input to a feedback loop, and uses the transmit clock signal as a negative input to the feedback loop. After digital phase detection and digital filtering, a filtered error signal s is generated and used to control a modified fraction for control of the fractional-N synthesizer. Disclosed techniques advantageously exhibit jitter attenuation and have relatively little jitter accumulation, which are useful characteristics in telecommunication and data communication network clocking applications. Embodiments can be applied to loop timing, clock regeneration, and transport timing applications, and can be used when clock holdover is desirable.

26 Claims, 13 Drawing Sheets

JITTER ATTENUATION WITH A FRACTIONAL-N CLOCK SYNTHESIZER

BACKGROUND

1. Field of the Invention

Embodiments of the invention generally relate to electronics, and in particular, to network clocking.

2. Description of the Related Art

Digital telecommunication and data communication networks are formed from a number of nodes, each of which may have different functions. In most networks, signals are interchanged between nodes using serial bit streams. Typically, a clock signal is recovered from a received serial bit stream, and the clock signal is then used to synchronize and extract data from the incoming data stream.

FIG. 1 illustrates a conventional example of a serializer/deserializer or SerDes, which is a combination of a serializer and a deserializer. A serializer is a circuit block that converts a parallel word stream into a serial bit stream. A deserializer is circuit block that converts a serial bit stream into a parallel word stream with a recovered clock signal.

The transmit (serializer) portion includes a clock synthesizer 102, a parallel/serial converter 104, and a transmitter (TX) 106. The clock synthesizer 102 generates a transmit clock by multiplying the frequency of a reference clock signal 108. Parallel transmit data words 110 are synchronized by a divided-down version of the transmit clock and are converted to a serial bit stream by the parallel/serial converter 104 that is then typically provided off chip as an output by the transmitter (TX) 106.

The receive (deserializer) portion includes a receiver (RX) 122, a clock recovery circuit 124, and a serial/parallel converter 126. The serial bit stream is brought on-chip and conditioned by the receiver (RX) 122, and a clock signal is recovered by the clock recovery circuit 124. The data is then converted to a series of parallel words 128 by a serial/parallel converter 126, which are synchronized by a divided-down version of the recovered clock signal.

In many modern practical SerDes, the clock synthesizer 102 also drives the clock recovery circuit 124, in effect training the clock recovery circuit 124 to operate at an appropriate frequency. This concept is represented the dotted line 132 from the clock synthesizer 102 to the clock recovery circuit 124.

FIG. 2 illustrates a conventional example of a phase-locked loop (PLL). A PLL is a fundamental block that is often used to process the clock signals in a SerDes. A PLL has three major elements: a phase detector 202, a loop filter 204, and a controlled oscillator 206. Depending upon the application of the PLL, the phase detector 202, loop filter 204, and controlled oscillator 206 can be implemented in a number of different ways, ranging from fully-analog implementations to fully-digital asynchronous implementations, to fully-digital synchronous implementations, with many intermediate implementations that incorporate aspects of one or more of the other implementations, with varying levels of implementation and integration complexity. In conventional SerDes implementations, there are typically at least two PLLs. A first PLL performs the clock synthesis function, while a second performs the clock recovery function.

FIG. 3 illustrates a conventional example for the clock synthesizer 102 implemented with a clock synthesis PLL. The clock synthesizer 102 multiplies the reference clock signal 108, which typically operates in the tens to hundreds of megahertz, up to a line-rate transmit clock signal, typically in the gigahertz, which is used to clock serial data out from the SerDes. An integer frequency divider 302 in the feedback path, a phase/frequency detector 304 and a loop filter 306 operate such that the output frequency Fout of a controlled oscillator 308 is an integer-multiplied version of the incoming reference Fref. The phase/frequency detector 304 is a type of phase detector.

FIG. 4 illustrates another conventional example for the clock synthesizer 102. By incorporating additional dividers 402, 404 on the PLL input and/or on the PLL output as shown in FIG. 4, a number of different possible output clock frequencies can be synthesized, such as frequencies that are simple integer ratios of the various dividers. In clock synthesis PLLs, the loop filter 306 and the controlled oscillator 308 are typically analog circuits, with the loop filter 306 being a resistor-capacitor network and the controlled oscillator 308 usually being an analog voltage-controlled oscillator (VCO); however there are many alternatives known to those of ordinary skill in the art. In addition, other techniques exist, such as the use of controlled delay lines and Delay-Locked Loops (DLLs) that can be used to construct the clock synthesizer 102.

FIG. 5 illustrates a conventional example of a clock recovery circuit based on a clock recovery PLL. In the context of a SerDes, the clock recovery circuit recovers the clock signal from the serial bit stream that is being provided as an input to the SerDes. The clock recovery PLL uses a phase detector 502 and a loop filter 504 to control a controlled oscillator 506 to recover a recovered clock signal 508 that is synchronized to the incoming data bit stream 510. The recovered clock signal 508 is then used to re-sample and re-synchronize the incoming data bit stream 510 using a D-type flip-flip DFF 512. In older-generation SerDes circuits, the loop filter 504 and the controlled oscillator 506 were typically implemented using a resistor-capacitor network and a VCO, respectively.

FIG. 6 illustrates another conventional example of a clock recovery circuit. In a modern SerDes, the loop filter 504 for the clock recovery circuit is typically implemented using a digital signal processing (DSP) filter. The controlled oscillator 506 illustrated in FIG. 5 is implemented with a clock synthesizer 602 and a phase rotator 604. The clock synthesizer 602 generates a fixed frequency clock signal, which is adjusted or phase rotated by the phase rotator 604 to generate the recovered clock signal 508. The phase rotator 604 can be implemented by a variety of techniques, such as, fully synchronous dividers, multiple-phase generation and picking, phase interpolation, single-side-band (SSB) modulators, and the like. The circuit of FIG. 6 is generally recognized to be both smaller in area and lower in power consumption than older analog circuit implementations.

Most PLLs, including those used for clock synthesis and clock recovery, are described as having low-pass transfer functions. Clock synthesizers and clock recovery circuits that are constructed without PLLs can also be described with low-pass transfer functions, and are typically analyzed in a similar manner to those with PLLs.

A transfer function describes the response of a PLL to a small-signal modulation of the input frequency to the output frequency. In networking theory, the transfer function is often referred to as a jitter transfer function (JTF). A PLL's bandwidth normally refers to the corner frequency of the low-pass JTF, which describes the frequency band in which jitter or noise on the incoming clock signal or in the feedback dividers will be transferred to the output. At the same time, the PLL bandwidth (corner frequency) normally can be used to construct a second transfer function, which describes the gain from components within the loop (phase detector 502, the loop filter 504, the controlled oscillator 506, 602/604, etc) to the output. Typically, the second transfer function characteristic is that of a high-pass filter having the same bandwidth (corner frequency) as the low-pass filter, where noise below the bandwidth (corner frequency) should be filtered out by the PLL itself. As a result of these two transfer functions, there is a tradeoff between the two differently-filtered types of jitter, meaning that there is an optimum PLL bandwidth to minimize the total jitter at the output from the PLL. For non-PLL-based clock synthesis and clock recovery, the second transfer function may take a slightly different form, which changes optimization criteria slightly, but not obviate the need for optimization.

In most applications, a clock synthesizer will have a relatively high bandwidth, typically measured in hundreds of kilohertz (kHz) to low single-digit megahertz (MHz), depending upon many factors. A clock recovery circuit will typically have an extremely wide bandwidth, often 1 or 2 orders of magnitude higher than the bandwidth of the accompanying clock synthesizer. A wide bandwidth is used for robust SerDes operation in the presence of channel impairments.

It can be difficult to implement an extremely low bandwidth fully-analog PLLs in an integrated circuit. The narrow bandwidth typically requires relatively large loop filter components, and the intrinsic jitter of available on-chip oscillators (generally multi-vibrators, ring oscillators or LC-tank oscillators) can be prohibitively large. As a result, low bandwidth PLLs are usually either constructed using discrete components on a board or are not constructed using analog techniques.

Non-idealities can accompany a wide bandwidth selection for clock recovery. These non-idealities can include jitter peaking (noise gain at certain frequencies) and non-linear and quantization effects that come from a modern DSP-based SerDes clock recovery, particularly from non-PLL-based solutions. If the recovered clock signal from one link were to be used directly as the transmit clock signal for another link, the receiver at the end of that second link would experience the jitter from the first link's clock recovery, and will add its own non-idealities to the clock signal, which is a process known as jitter accumulation. After a certain number of such links with jitter accumulation, there is likely to be an excessive amount of jitter at certain frequencies that will cause the link to fail. As a result, it is generally not a good design practice to use a recovered clock to directly clock a transmitter.

Most clock synthesis PLLs, including those shown in FIG. 4, are what is termed Integer-N PLLs. In PLLs like this, the frequency resolution of the output is determined by a ratio of integer divide ratios. By programming the dividers separately at different times it is possible to produce different output frequencies. The use of relatively large dividers, in particular at the pre-divider 402 (FIG. 4), permits relatively fine frequency resolution at the output to be achieved. However the foregoing technique limits the bandwidth of the PLL. In general, practical clock synthesis PLLs have a maximum bandwidth that is approximately one tenth of the reference clock frequency. When the pre-divider 402 is used, the reference clock frequency to the PLL is effectively divided by the pre-divider amount, which limits the maximum bandwidth of the PLL to as low as 100 Hz or lower for the finest-resolution PLLs.

FIG. 7 illustrates a fractional-N PLL, which is an alternative to a low-bandwidth Integer-N clock synthesis PLL. A dashed box outlines components for a fractional-N synthesizer 700. In a fractional-N PLL, a feedback divider 702 is controlled and is modulated by a fractional-N modulator 704 such that the feedback divider 702 can divide by X, where X is an integer that may change between successive divide cycles. The fractional-N modulator 704 can be a digital state machine that generates a long-term average feedback mean (X)=$\overline{X}$ divider ratio selected by an additional control, typically a rational fraction of two typically large integers: numerator n; and denominator d, such that $$\overline{X} = \frac{n}{d}.$$

The illustrated fractional-N modulator uses an output of the feedback divider 702 for clocking of the state machine; however, other configurations are possible.

The modulation of the feedback divider 702 from the fractional-N modulator 704 introduces additional jitter at the input of the phase/frequency detector 304, so the additional jitter should be low-pass filtered by the PLL loop just as if it had been jitter on the input clock signal Fref. If the additional jitter is mostly of a high-frequency jitter characteristic, the PLL's low-pass filter operation should remove the majority of the jitter from the output without requiring an extremely low PLL bandwidth. The required bandwidth of a fractional-N clock synthesis PLL is typically at least an order of magnitude smaller than that of an integer-N PLL; however in many PLL configurations, the bandwidth used for optimum PLL output jitter is often similar for the two types so the distinction makes very little practical difference. In order to ensure that the feedback divider jitter is at high frequency, most practical fractional-N PLLs use a Delta-Sigma modulator (or something similar) to modulate the feedback divider 702. While fractional-N techniques can be used without a PLL, most practical fractional-N clock synthesizers are implemented with PLLs because the low-pass transfer function of a PLL provides significant benefits for output jitter.

FIG. 8 illustrates a loop-timed SerDes with a jitter attenuator (JAT) 802. Circuits for startup are not shown in FIG. 8, but are well known to those of ordinary skill in the art. Loop-timing is used in some applications, such as in synchronous and asynchronous networks. With loop-timing, the recovered clock signal from an incoming serial data stream is used as the transmit clock signal for one or more outgoing serial streams. The JAT 802 prevents jitter accumulation by filtering the recovered clock signal. The JAT 802 is disposed in the signal path between the clock recovery circuit 124 and the clock synthesizer 102 (with possible other intervening components, such as a divider).

If the clock synthesizer's bandwidth were low enough, the JAT 802 would not be used, however in most practical systems the bandwidth used to filter the recovered clock signal from the clock recovery circuit 124 is one or two orders of magnitude (and often more) lower than the optimum minimum-jitter bandwidth of the clock synthesizer 102. The JAT 802 should have a relatively low bandwidth to filter the recovered clock signal, have exhibit relatively little jitter peaking, and should minimize jitter accumulation. The JAT 802 is typically implemented using a PLL.

In synchronous networking, a clock signal is typically distributed from a single master clock source located at one node. The clock reference can be distributed from that node to the entire network using a hierarchy of clock distribution. The clock signals are typically distributed via data links with clock signals recovered at the receive end. As a result, a node synchronizes its local transmit clock signal to an incoming clock signal from a node closer to the master clock source, and the entire system is effectively loop timed such that each node uses the clock recovery circuit 124 and the JAT 802 for clock distribution.

FIG. 9 illustrates two SerDes 900, 902 operating in a transport timing mode over a network 904. Transport timing refers to the transport of network synchronization, clocks, or data across a network 904 whose underlying clock reference may be asynchronous and unrelated to the clock reference of the information being transported. At an ingress node SerDes 900, recovered data is encoded for transport over the network 904, while the recovered clock signal is measured by a measurement block 906 and is also encoded for transport with the data over the network 904. At the egress node, the clock measurements are used to reproduce the recovered clock signal in the clock regeneration block 908, which is then used as the reference for the egress node SerDes 902. FIG. 9 illustrates a bi-directional link, where information is transported back through the network system through SerDes 902, clock measurement block 910, network 904, clock regeneration block 912, and SerDes 900; however unidirectional links may also be transport timed. For clarity, circuitry for startup is not shown, but is well known to those of ordinary skill in the art.

Various techniques can be used to measure the asynchronous clock signal at the ingress node to a network, and to transport the measurement across the network. Regenerating the clock signal at an egress node typically requires a block with some similarity to the loop-timed JAT 802 (FIG. 8). Because network timing updates can be irregularly spaced over time, transport timing should be used with a filter having a relatively low bandwidth, such as less than 100 Hz or even less than 10 Hz, to reduce jitter coming from the network. Because transport timing is open loop, additional techniques, such as loop timing, are used to keep the local reference clock signals of the ingress and egress nodes synchronized or to ensure that the frequency differences are known and bounded.

Clock holdover is another feature of synchronous network clocking Clock holdover refers to a feature in which a node remains frequency locked for a period of time even if its incoming reference clock signal is removed or unavailable. In most practical networks, there are hierarchies of frequency references with redundant distribution paths, such that if one master clock source or path becomes unavailable, the nodes will switch over to another master clock. Depending upon the application and its requirements, clock holdover can place frequency accuracy requirements between ±10 parts per billion to ±10 parts per million over timescales measured between minutes and days without a master reference.

Clock holdover is typically implemented as a requirement of the JAT 802, such that in the absence of a recovered master clock source, the JAT 802 should hold its output frequency relatively steady until an alternate master clock source can be used.

As discussed earlier, the JAT 802 is typically implemented using a low-bandwidth PLL. Low-bandwidth PLLs, and in particular, low-bandwidth analog PLLs, can be difficult to implement. In general, low-bandwidth PLLs reject relatively little noise from the oscillator, and use relatively large loop filter components. As a result, integrated low-bandwidth PLLs tend to be large and exhibit relatively large output jitter. Thus, integrated circuits techniques were not initially used for implementation of the JAT 802. Rather, external loop filter components and controlled oscillators, such as voltage-controlled surface acoustic wave oscillators (VCSO) or voltage-controlled crystal oscillators (VCXO) had been used. Those solutions can be cost prohibitive and can make it impractical to implement in a high-density device.

FIG. 10 illustrates a conventional example of an integrated loop-timed JAT that uses a digital PLL rather than an analog PLL. A digital PLL is formed by a digital phase detector 1002, a digital JAT loop filter 1004, a numerically-controlled oscillator (NCO) 1006, the clock synthesizer 102 and the clock recovery circuit 124. The clock synthesizer 102 and the clock recovery circuit 124 can correspond to the same blocks described earlier in connection with FIGS. 1 and 8, while the NCO 1006 can be as simple as a programmable digital divider running from a low-frequency reference clock or may be significantly more complex. The NCO 1006 can include techniques such as the use of a high-frequency multi-GHz reference clock, multiple phases of a reference clock, programmable delay lines, or other techniques similar to those described earlier in connection with the phase rotator 604 (FIG. 6).

A JAT 1000 is formed by the digital phase detector 1002, the digital JAT loop filter 1004, the NCO 1006. The digital phase detector 1002 and the digital loop filter 1004 drive the NCO 1006. An output of the NCO 1006 is used as the reference signal for the clock synthesizer 102. The output of the clock synthesizer 102, via the clock recovery circuit 124, is provided as an input to the digital phase detector 1002 to close a feedback loop and to phase and frequency lock the outputs of the clock recovery circuit 124 and the clock synthesizer 102 together.

By using a digital (DSP-based) loop filter, the low-bandwidth requirement of the JAT can be readily achieved. However, simple forms of the NCO 1006, such as those where the NCO 1006 is an digital divider is driven from a low frequency reference clock, can generate a relatively large amount of output jitter, which requires the clock synthesizer 102 to have a low bandwidth to attenuate this jitter, which complicates the specification and design of the clock synthesizer 102.

As an alternative to reducing the bandwidth of the clock synthesizer 102, the NCO's output jitter can be reduced by using a second optional clock synthesizer 1008, which allows the NCO 1006 to provide finer-resolution (and lower jitter) clocks at its output. This second clock synthesizer 1008 typically multiplies a reference clock signal's frequency to a higher frequency in order to provide a stable high-frequency clock to the NCO 1006. The bandwidth of the clock synthesizer 102 can then be increased, which simplifies its design and allows it to be better optimized in isolation from the JAT. The NCO's output jitter can be further reduced by using multiple phases from the second clock synthesizer 1008 or by using more complex NCO configurations, such as programmable delay lines or techniques similar to those described earlier in connection with the phase rotator 604 (FIG. 6).

Jitter accumulation is an issue with the circuit illustrated in FIG. 10. The cascading of the clock recovery circuit 124, the NCO 1006, and the two clock synthesizers 102, 1008, results in jitter accumulating through the system, which both increases jitter on the output and makes it more difficult to specify and measure jitter. In addition, the use of the second clock synthesizer 1008 and/or a complex NCO 1006 adds area and power to the overall circuit.

FIG. 11 illustrates a transport timing circuit for a jitter attenuator (JAT) 1100 with a similar topology to the circuit of FIG. 10. Instead of the digital phase detector 1002 (FIG. 10) used in the loop-timed JAT, a clock measurement packet decoder block 1102 interprets incoming timing measurements and drives a digital filter 1104, which drives the NCO 1006 as in FIG. 10. The discussion of jitter in connection with FIG. 10 is also applicable to the circuit illustrated in FIG. 11.

Clock holdover requirements for either loop-timed or transport-timed applications are similar. In the absence of a recovered clock signal or network timing packets, the digital JAT loop filter 1004 can hold its previous value and drive the NCO 1006 at a fixed frequency, provided there is a stable reference clock frequency. As a result, if the intrinsic jitter at the output of the clock synthesizer 102 meets the requirements and if the reference clock frequency is stable, the circuits of FIG. 10 and FIG. 11 can meet clock holdover requirements. If the reference clock frequency is not stable, but is instead variable with a measurable external input, such as temperature, clock holdover performance can be improved by measuring the external input and compensating for the variation.

SUMMARY

The invention includes a circuit that uses a fractional-N modulator and a fractional-N clock synthesizer to generate a clock signal, such as a transmit clock signal, from a reference clock signal. The circuit can be, but is not limited to, a digital phase-locked loop (PLL) with loop timing or a transport timing loop. One embodiment uses a recovered clock signal derived from serial received data as a positive input to a feedback loop, and uses the transmit clock signal as a feedback loop input to the feedback loop. After digital phase detection and digital loop filtering, a signal s is generated and used to control a modified fraction for control of the fractional-N synthesizer. Disclosed techniques advantageously exhibit jitter attenuation and have relatively little jitter accumulation, which are useful characteristics in telecommunication and data communication network clocking applications. Embodiments can be applied to loop timing, clock regeneration, and transport timing applications, and can be used when clock holdover is desirable.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

An integrated loop-timed jitter attenuator for a SerDes has been difficult to implement. The low-bandwidth nature of a conventional jitter attenuator (JAT), combined with relatively low jitter transmit clock frequencies, has made implementation difficult. Embodiments of the invention overcome these difficulties.

While illustrated in the context of phase-locked loop (PLL) based clock recovery techniques, the principles and advantages described herein will be applicable to other clock recovery techniques, such as, but not limited to, over-sampling the incoming data, DSP interpolation, calibrated delay lines, and DLLs. These other clock recovery techniques respond to incoming data in a manner similar to a PLL.

Figure 8:
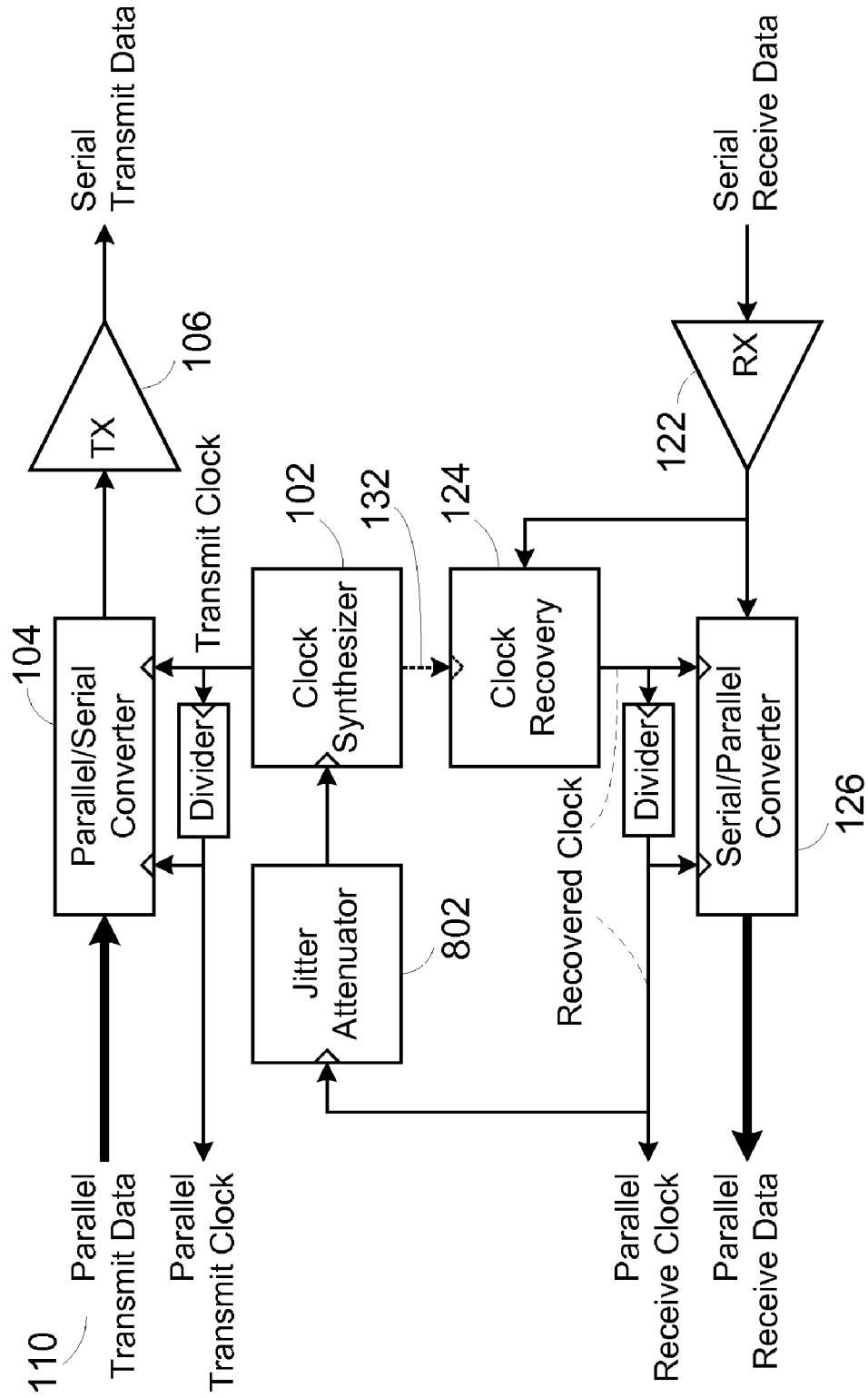
FIG. 8 illustrates a loop-timed SerDes with a jitter attenuator (JAT).
Figure 9:
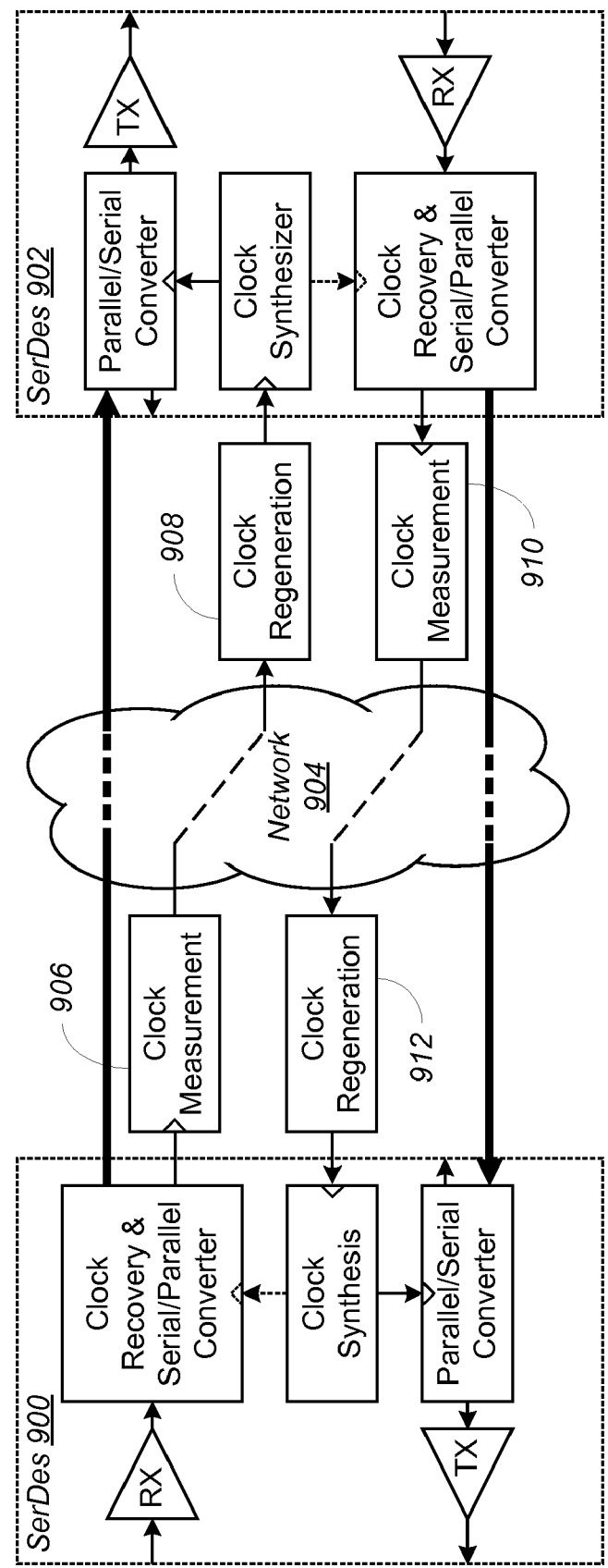
FIG. 9 illustrates two SerDes operating in a transport timing mode over a network.
Figure 12:
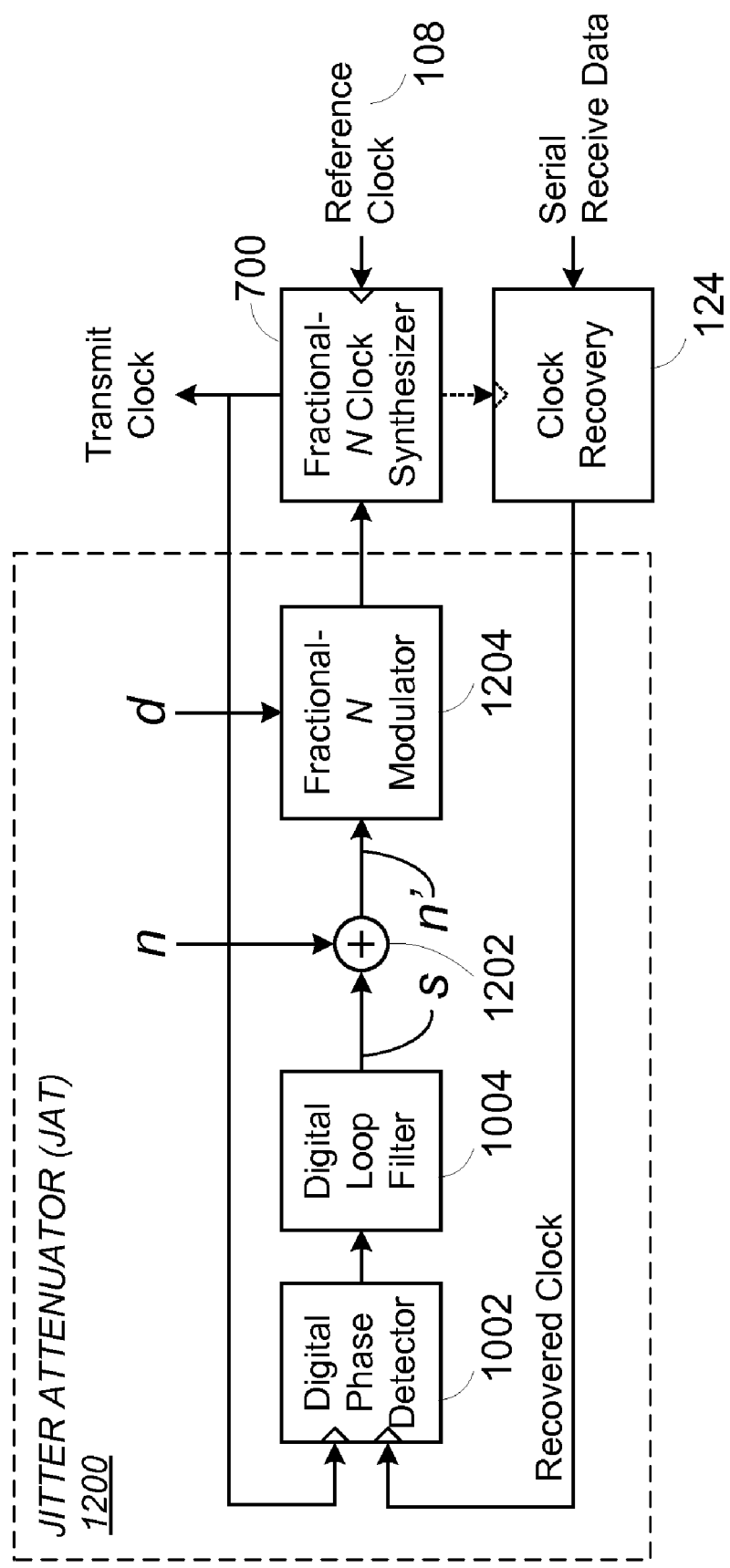
FIG. 12 illustrates a digital PLL with loop timing according to an embodiment of the invention.

FIG. 12 illustrates a digital phase-locked loop (PLL) according to an embodiment of the invention. The digital PLL is illustrated in a loop timing configuration with fractional-N clock synthesis 700 and has the functionality of the circuit with loop timing illustrated in FIG. 10, but with better performance and lower cost (smaller chip area). A dashed box outlines components for a jitter attenuator (JAT) 1200 portion of the PLL. The illustrated embodiment is well suited to environments in which attenuation of jitter is desirable, such as in loop timing as illustrated in FIG. 12 and earlier in connection with FIGS. 8 and 10. However, the digital PLL can also be used in other environments.

Figure 10:
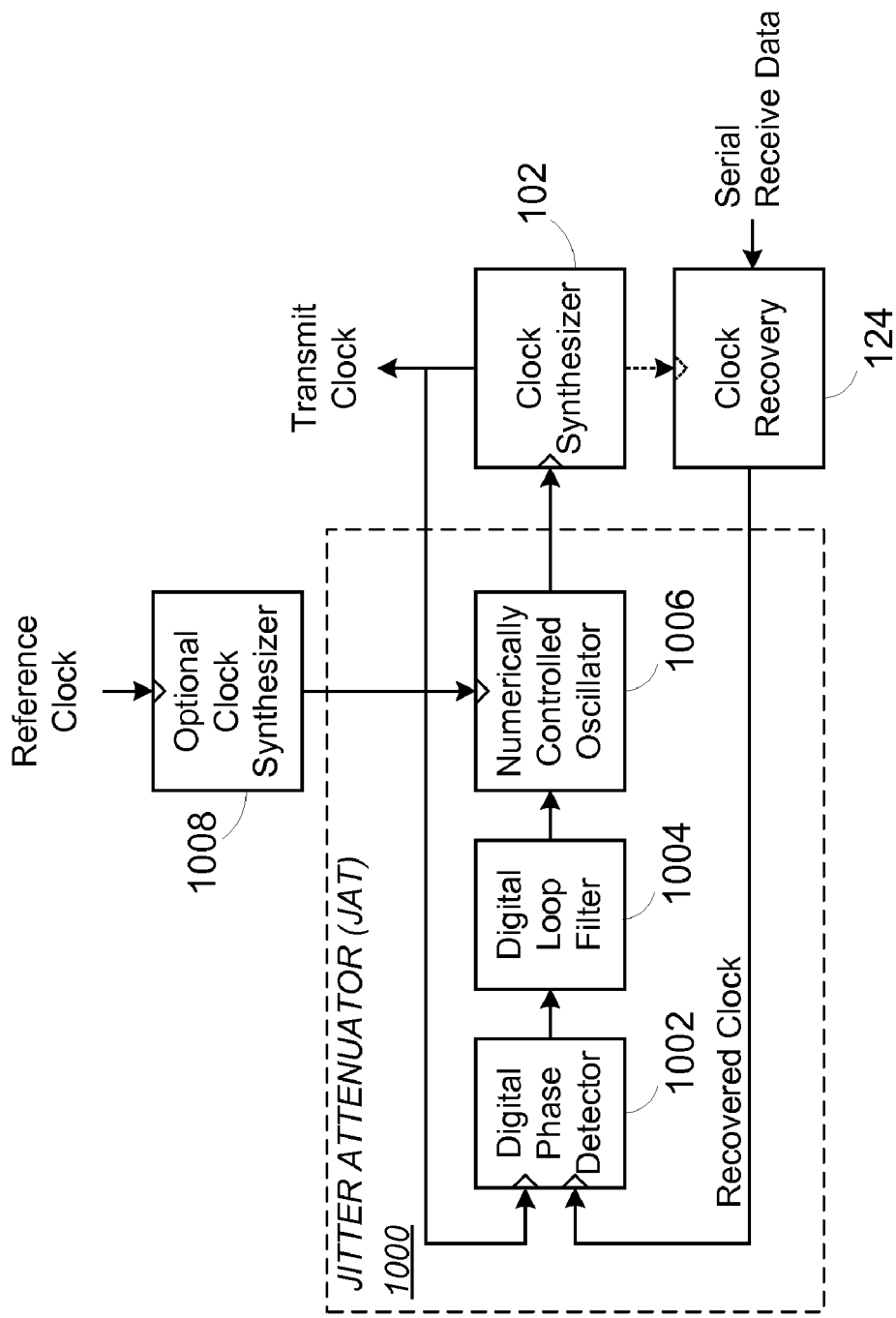
FIG. 10 illustrates a conventional example of a digital PLL that can be used for an integrated loop-timed jitter attenuator (JAT).

An embodiment of the invention as illustrated in FIG. 12 can be implemented in a substantially simpler and more compact manner than the conventional art as illustrated in FIG. 10. The operation of the digital phase detector 1002 and the digital JAT loop filter 1004 are as described earlier in connection with FIG. 10. The output of the digital phase detector 1002 is referred to as an error signal. The output of the digital JAT loop filter 1004 is referred to as a filtered error signal s. As discussed earlier in connection with FIG. 10, the digital JAT loop filter 1004 sets the bandwidth of the digital PLL, filtering the recovered clock signal (output of the clock recovery 124) before it is used by other circuits to transmit data. The NCO 1006 of the conventional art of FIG. 10 is advantageously not needed in the illustrated embodiment. The digital JAT loop filter 1004 controls the fractional-N clock synthesizer 700 via an adder 1202 and a fractional-N modulator 1204.

Figure 1:
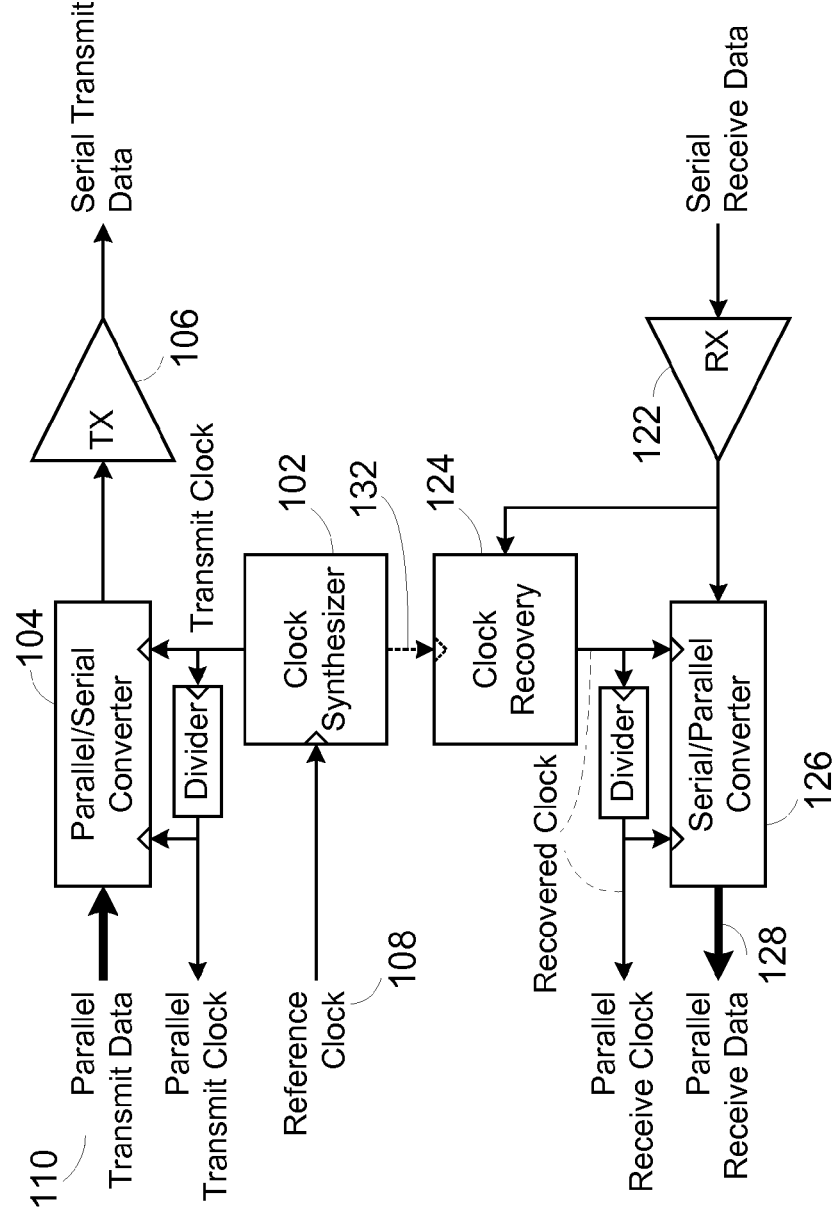
FIG. 1 illustrates a conventional example of a serializer/deserializer or SerDes.
Figure 2:
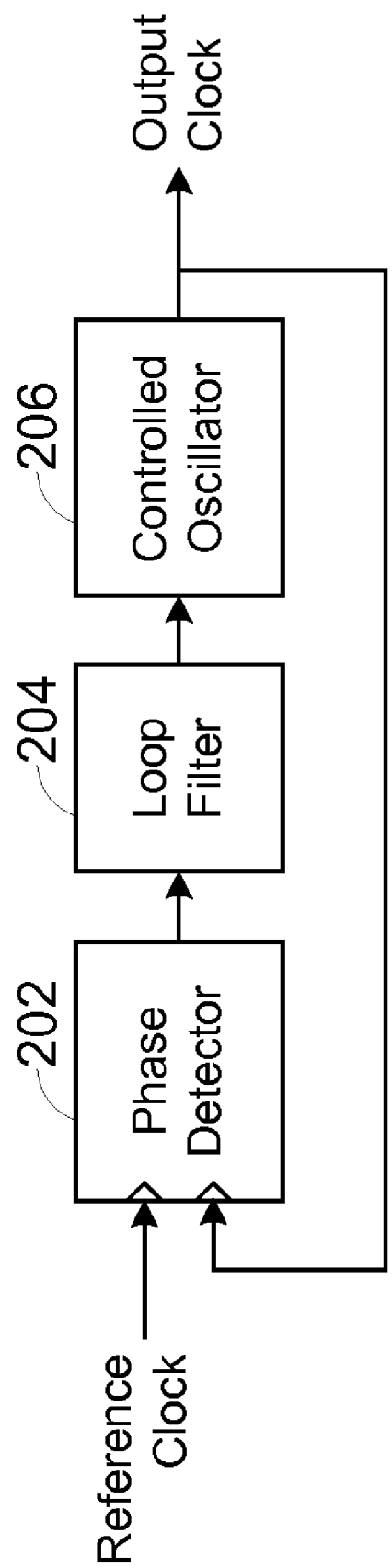
FIG. 2 illustrates a conventional example of a phase-locked loop (PLL).
Figure 3:
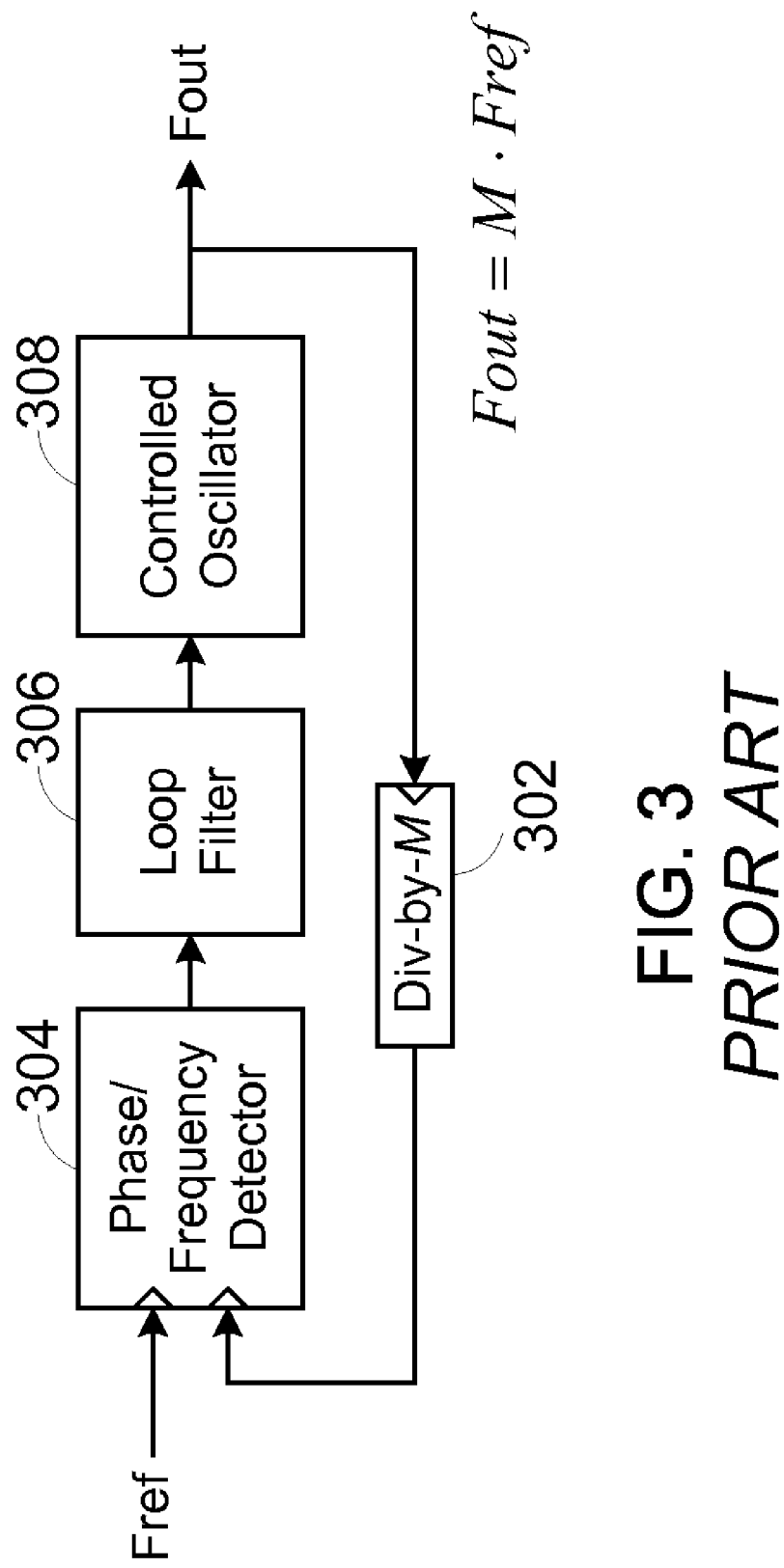
FIG. 3 illustrates a conventional example of a clock synthesizer implemented with a clock synthesis PLL.
Figure 4:
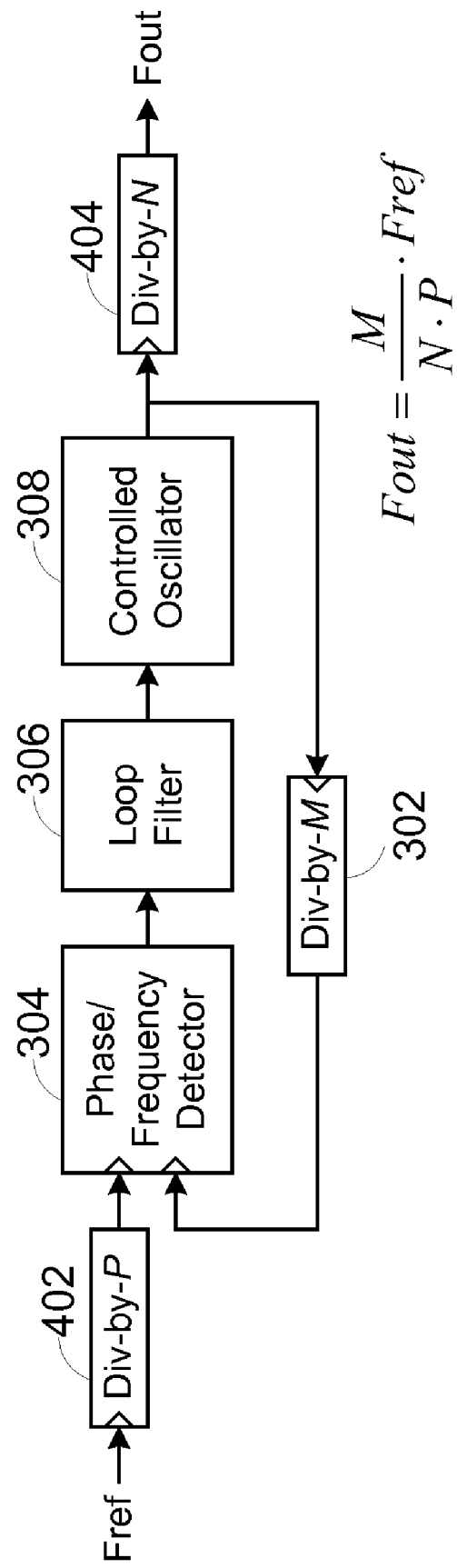
FIG. 4 illustrates another conventional example for a clock synthesizer.
Figure 5:
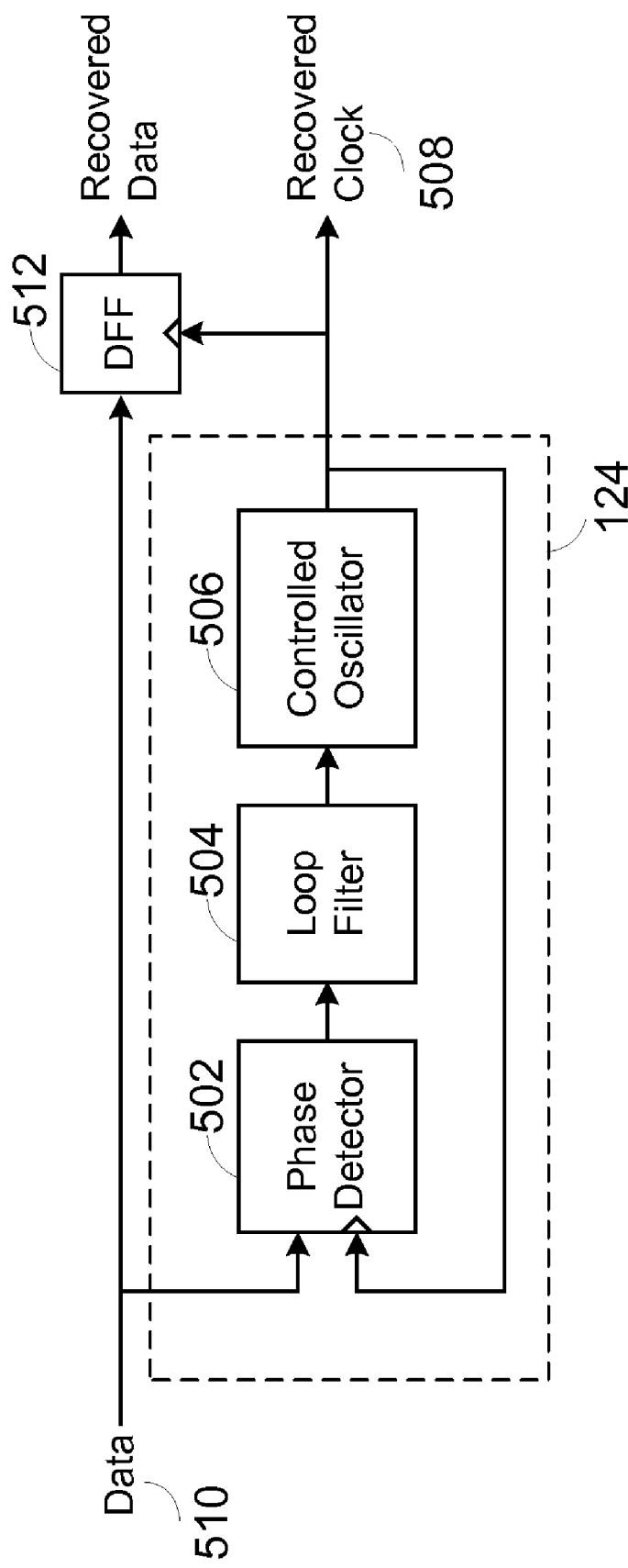
FIG. 5 illustrates a conventional example of a clock recovery circuit based on a clock recovery PLL.
Figure 6:
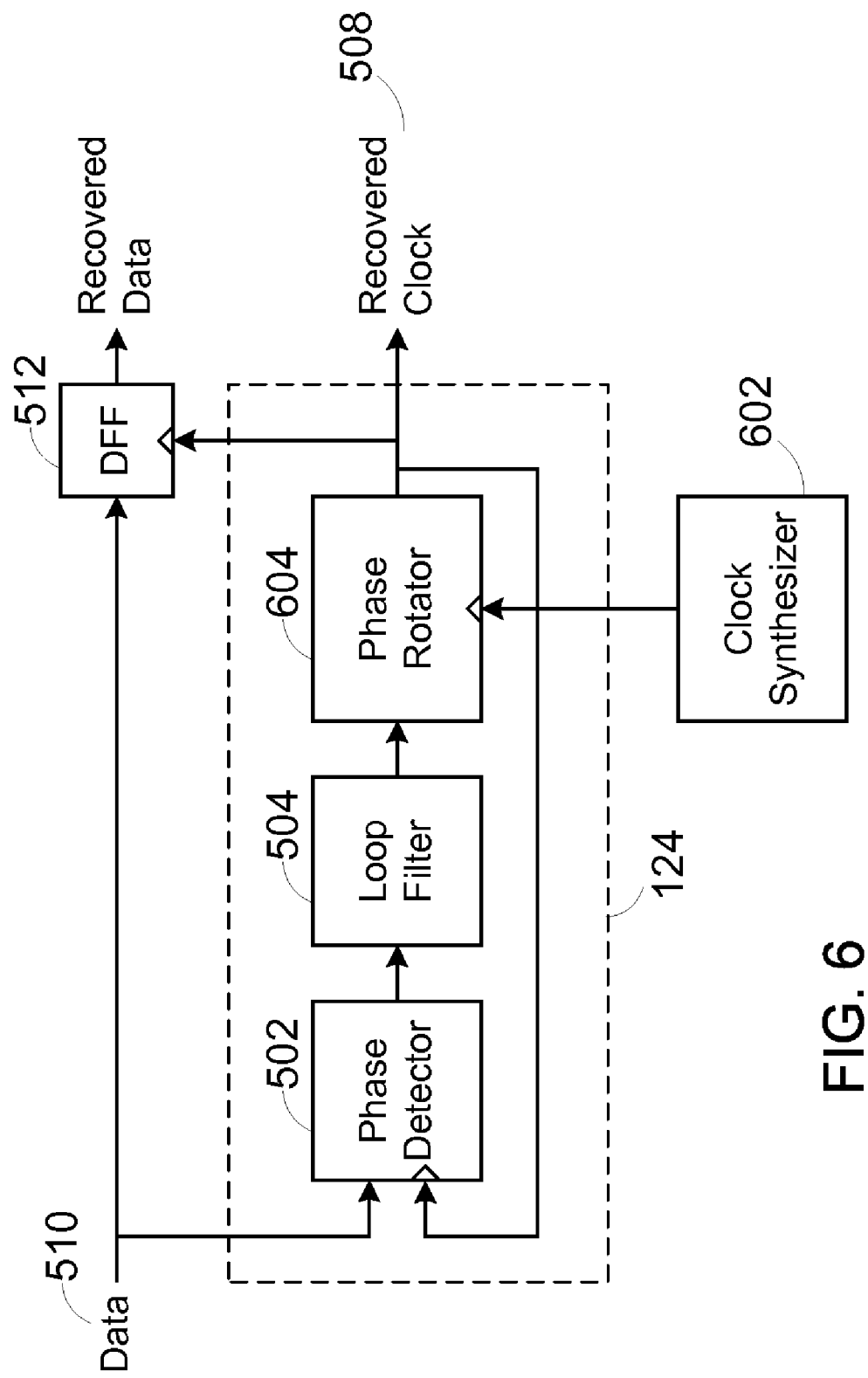
FIG. 6 illustrates another conventional example of a clock recovery circuit.
Figure 7:
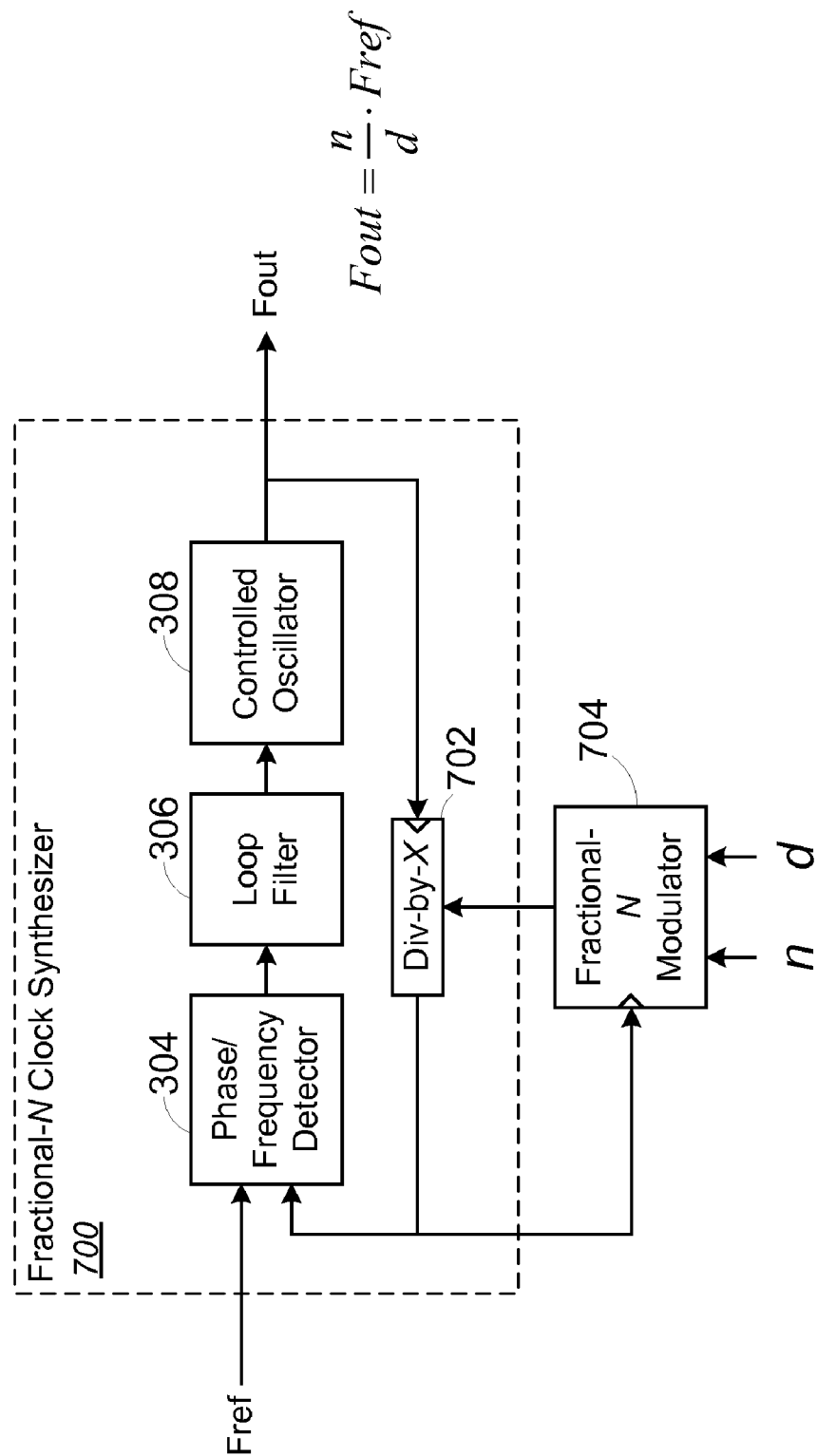
FIG. 7 illustrates a fractional-N PLL, which is an alternative to a low-bandwidth Integer-N clock synthesis PLL.

In contrast to the fractional-N modulator 704 (FIG. 7), which receives a numerator n and a denominator d as inputs, the fractional-N modulator 1204 receives a modified numerator n' as an input and the denominator d as an input. The numerator n and the denominator d can be selected by another control for the desired frequency division in the timing loop, which multiples the frequency output of the fractional-N clock synthesizer 700.

The modified numerator n' is an output of the adder 1202, which sums the numerator n and the filtered error signal s of the digital JAT loop filter 1004. The fractional-N modulator 1204 uses the modified numerator n' and the denominator d to provide a control signal to the fractional-N clock synthesizer 700. In the illustrated embodiment, the polarities are such that the filtered error signal s is generally positive when the recovered clock signal is earlier in phase or faster in frequency than the transmit clock signal, there is no phase inversion in the fractional-N modulator 1204, and control input to the fractional N-clock synthesizer 700 operates such that a more positive quantity increases the frequency of the transmit clock.

Along with removal of the NCO 1006 (FIG. 10), the second clock synthesizer 1008 (FIG. 10) has also been removed, and the reference clock signal can directly drive the fractional N-clock synthesizer 700. An example of a circuit that can be used for the fractional N-clock synthesizer 700 was described earlier in connection with FIG. 7.

Advantageously, the illustrated embodiment of FIG. 12 consumes less chip area and power, and because the circuit has fewer elements and fewer loops, the circuit is easier to specify, design and test. The fractional-N clock synthesizer 700 and the clock recovery circuit 124 can now have bandwidths that are appropriate to their application, and the coupling between the jitter attenuation (JAT) bandwidth and the clock synthesizer bandwidth has been removed. In addition, because there are fewer circuit blocks between the reference clock signal and the transmit clock signal, jitter accumulation has been reduced, which reduces the jitter seen at the transmit output. Finally, the PLL's startup can be much easier to control because of the fewer number of elements and loops, as well as the relative ease with which the fractional-N clock synthesizer 700 can be controlled.

Figure 11:
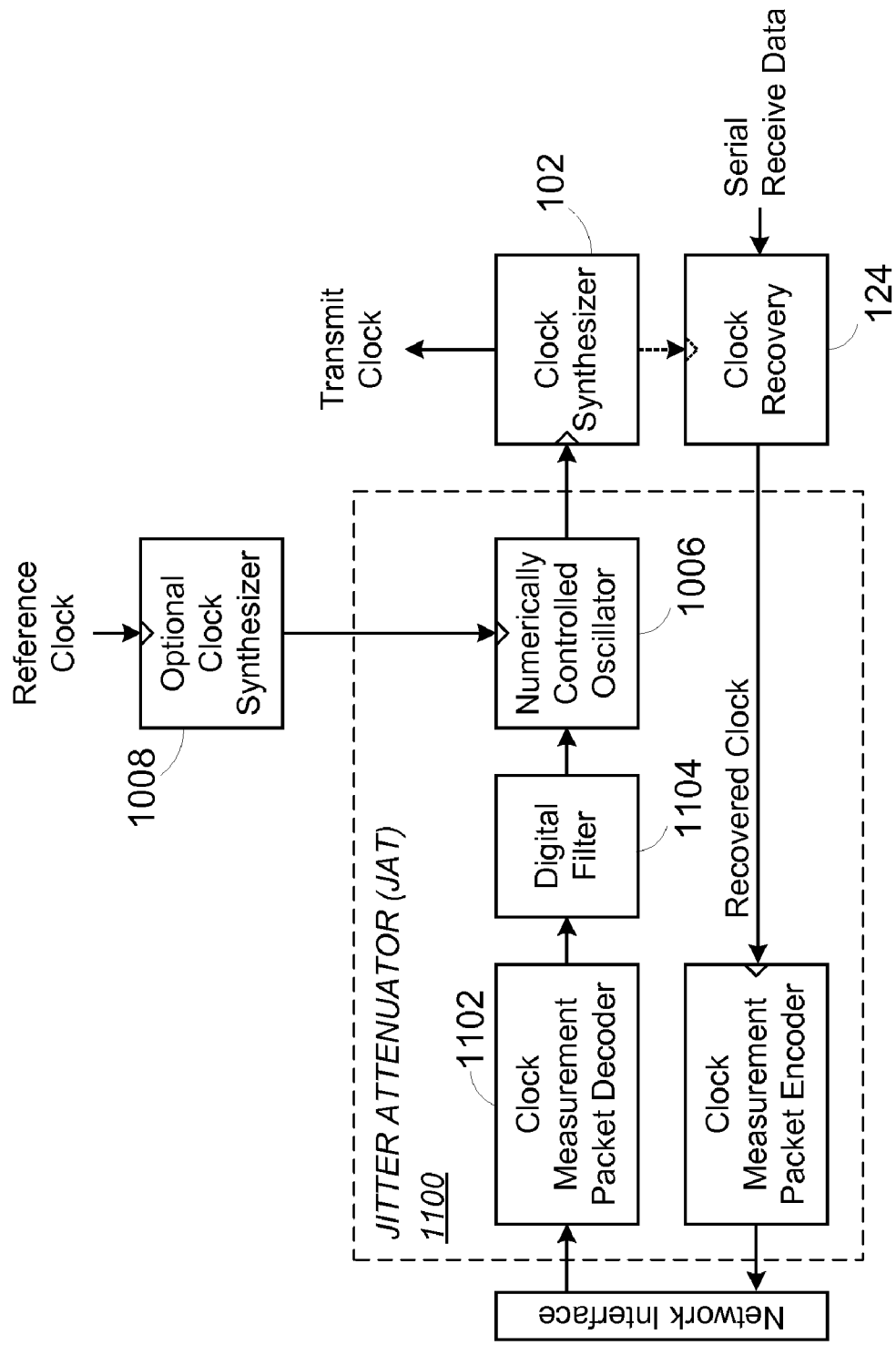
FIG. 11 illustrates a transport timing circuit with a similar topology to the circuit of FIG. 10.
Figure 13:
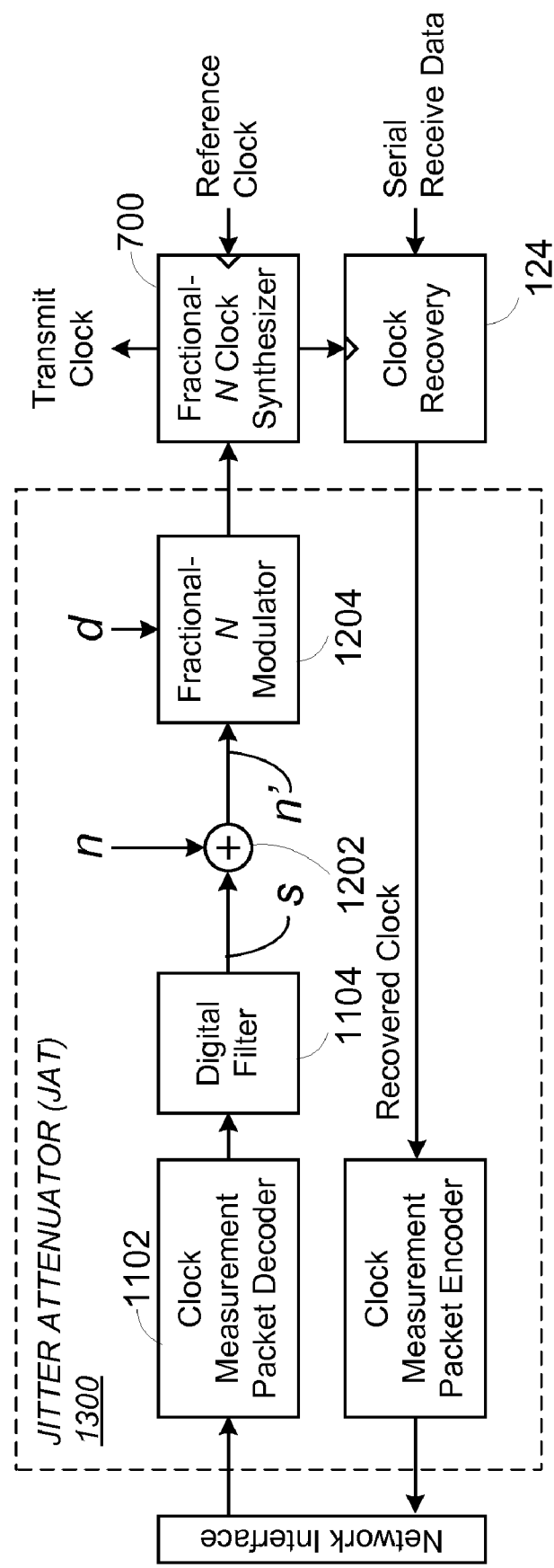
FIG. 13 illustrates a transport timing circuit according to an embodiment of the invention that can be used to attenuate jitter.

The principles and advantages discussed in connection with the loop timing embodiment of FIG. 12 are also applicable to transport timing as shown in FIG. 13. In comparison to the conventional circuit of FIG. 11, an embodiment of the invention as illustrated in FIG. 13 is significantly simplified. As was the case earlier in connection with FIG. 12, the clock synthesizer 102 (FIG. 11) has been replaced with the fractional-N clock synthesizer 700, and the NCO 1106 and its corresponding second clock synthesizer 1008 are no longer used. A dashed box indicates a jitter attenuator (JAT) 1300 of the transport timing circuit.

In alternative embodiments to those illustrated in connection with FIGS. 12 and 13, rather than modify numerator n to generate a modified numerator n', the denominator d is modified to a modified denominator d' and used by the fractional-N modulator 1204. Of course, the adder 1202 can also then be configured to subtract the filtered error signal s from denominator d to generate the modified denominator d'. For example, subtracting can be implemented via addition with a 2's complement. Accordingly, while the term "adder" will be used herein, the adder 1202 can be used for either addition or subtraction.

There are numerous advantages associated with the embodiments described in connection with FIGS. 12 and 13. These advantages include one or more of the following: lower jitter, lower power consumption, lower area, greater rate flexibility, and greater reference flexibility. Each of these is discussed in further detail below.

Lower jitter is an advantage. Since there is only one clock synthesizer 700 between the reference clock signal 108 and the synthesized transmit clock, there is lower jitter. By not cascading multiple clock synthesis and clock recovery blocks, a substantial amount of jitter accumulation has been avoided, and the intrinsic jitter of the transmit output will be independent of whether or not the JAT functionality has been engaged. The disclosed approach also reduces the number of levels of circuitry that the reference clock signal 108 passes through, which reduces power supply-induced jitter on the reference clock signal 108.

Lower power consumption is an advantage. By removing the NCO and its additional clock synthesizer, the power consumption of these blocks has also been removed. The increased power used to make the transmit clock synthesizer 700 of a fractional-N configuration can be expected to be less than the power saved.

Lower area is an advantage. By removing the NCO and its additional clock synthesizer, the corresponding chip area used by the circuit is smaller. The increased area used to make the transmit clock synthesizer of a fractional-N configuration can be expected to be less than the area saved.

Greater rate flexibility is an advantage. By using fractional-N clock synthesis, the number of different possible SerDes bit rates supported from a single reference is greatly enhanced. This can be important for "Any Service, Any Port" applications.

Greater reference flexibility is an advantage. By using fractional-N clock synthesis, the variation in the possible reference clock signals that a SerDes can use to meet a particular reference is greatly enhanced. This is particularly important when retrofitting an existing design to add new rates, because the available reference clock signals may not be appropriate for use with an integer-N clock synthesizer.

Further, the fractional-N technology readily enables spread-spectrum clocking of the transmit clocks, which can reduce EMI. In addition, fractional-N technology can readily allow compensation for external forces, such as temperature, on the reference clock signal. Also, fractional-N technology readily enables "Any Service, Any Port" and "Any Reference, Any Service" applications by removing a requirement that the target data rate and the available reference clock be related, maximizing flexibility. Moreover, fractional-N technology readily permits a smooth ramp of frequency between one reference frequency and another for applications in which reference clock signals can be switched.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Various embodiments have been described above. Although described with reference to these specific embodiments, the descriptions are intended to be illustrative and are not intended to be limiting. Various modifications and applications may occur to those skilled in the art.

What is claimed is:

1. A method comprising:
   receiving a numerator integer and a denominator integer;
   generating an error signal based on detection of a difference in phase between a first clock signal and a second clock signal;
   filtering the error signal to generate a filtered error signal;
   combining the filtered error signal with at least one of the numerator integer or the denominator integer to generate a modified integer;
   modulating a fractional-N input of a fractional-N clock synthesizer based at least partly on the modified integer; and
   using the fractional-N clock synthesizer to generate the second clock signal based on a reference clock signal and the fractional-N input;

wherein the method is performed in its entirety by one or more electronic circuits.

2. The method of claim 1, wherein combining comprises adding the filtered error signal and the numerator integer to generate the modified integer, further comprising modulating the fractional-N input of the fractional-N clock synthesizer based on the modified integer and the denominator integer.

3. The method of claim 1, wherein combining comprises subtracting the filtered error signal from the denominator integer to generate the modified integer, further comprising modulating the fractional-N input of the fractional-N clock synthesizer based on the modified integer and the numerator integer.

4. The method of claim 1, further comprising:
receiving a serial data signal;
recovering the first clock signal from the serial data signal such that the first clock signal comprises a recovered clock signal;
wherein the second clock signal comprises a transmit clock signal.

5. The method of claim 4, wherein a center frequency for the first clock signal is determined by the fractional-N clock synthesizer.

6. The method of claim 1, wherein detecting, filtering, and combining are entirely performed by digital circuits.

7. An apparatus comprising:
a phase detector configured to detect a difference in phase between a first clock signal and a second clock signal, and to generate a error signal based on the detected difference;
a loop filter configured to filter the error signal to generate a filtered error signal;
an adder configured to combine the filtered error signal with at least one of a numerator integer or a denominator integer to generate a modified integer;
a fractional-N modulator configured to generate a modulated signal based at least partly on the modified integer; and
a fractional-N clock synthesizer configured to generate the second clock signal based on a reference clock signal and the modulated signal.

8. The apparatus of claim 7, wherein the adder is configured to adder add the filtered error signal and the numerator integer to generate the modified integer, wherein the fractional-N modulator is configured to generate the modulated signal based on the modified integer and the denominator integer.

9. The apparatus of claim 7, wherein the adder is configured to subtract the filtered error signal from the denominator integer to generate the modified integer, the fractional-N modulator is configured to generate the modulated signal based on the modified integer and the numerator integer.

10. The apparatus of claim 7, further comprising a clock recovery circuit configured to receive a serial data signal and to generate the first clock signal from the serial data signal such that the first clock signal comprises a recovered clock signal, wherein the second clock signal comprises a transmit clock signal.

11. The apparatus of claim 10, wherein a center frequency for the first clock signal is determined by the fractional-N clock synthesizer.

12. The apparatus of claim 7, wherein the phase detector, the loop filter, and the adder consist of digital circuits.

13. A method comprising:
receiving a numerator integer and a denominator integer;

generating an error signal based on decoding of a clock measurement packets, wherein the clock measurement packets encode information associated with timing of a first clock signal;
filtering the error signal to generate a filtered error signal;
combining the filtered error signal with at least one of the numerator integer or the denominator integer to generate a modified integer;
modulating a fractional-N input of a fractional-N clock synthesizer based at least partly on the modified integer; and
using the fractional-N clock synthesizer to generate a second clock signal based on a reference clock signal and the fractional-N input;
wherein the method is performed in its entirety by one or more electronic circuits.

14. The method of claim 13, wherein combining comprises adding the filtered error signal and the numerator integer to generate the modified integer, further comprising modulating the fractional-N input of the fractional-N clock synthesizer based on the modified integer and the denominator integer.

15. The method of claim 13, wherein combining comprises subtracting the filtered error signal from the denominator integer to generate the modified integer, further comprising modulating the fractional-N input of the fractional-N clock synthesizer based on the modified integer and the numerator integer.

16. The method of claim 13, further comprising:
receiving a serial data signal;
recovering the first clock signal from the serial data signal such that the first clock signal comprises a recovered clock signal;
wherein the second clock signal comprises a transmit clock signal.

17. The method of claim 16, wherein a center frequency for the first clock signal is determined by the fractional-N clock synthesizer.

18. The method of claim 16, further comprising encoding clock measurement packets with information associated with timing of the first clock signal.

19. The method of claim 13, wherein generating, filtering, and combining are entirely performed by digital circuits.

20. An apparatus comprising:
a clock measurement packet decoder configured to decode clock measurement packets, wherein the clock measurement packets encode information associated with timing of a first clock signal, wherein the clock measurement packet decoder is configured to generate an error signal based on the decoded information;
a filter configured to filter the error signal to generate a filtered error signal;
an adder configured to combine the filtered error signal with at least one of a numerator integer or a denominator integer to generate a modified integer;
a fractional-N modulator configured to generate a modulated signal based at least partly on the modified integer; and
a fractional-N clock synthesizer configured to generate a second clock signal based on a reference clock signal and the modulated signal.

21. The apparatus of claim 20, wherein the adder is configured to adder add the filtered error signal and the numerator integer to generate the modified integer, wherein the fractional-N modulator is configured to generate the modulated signal based on the modified integer and the denominator integer.

22. The apparatus of claim 20, wherein the adder is configured to subtract the filtered error signal from the denominator integer to generate the modified integer, the fractional-N modulator is configured to generate the modulated signal based on the modified integer and the numerator integer.

23. The apparatus of claim 20, further comprising a clock recovery circuit configured to receive a serial data signal and to generate the first clock signal from the serial data signal such that the first clock signal comprises a recovered clock signal, wherein the second clock signal comprises a transmit clock signal.

24. The apparatus of claim 23, wherein a center frequency for the first clock signal is determined by the fractional-N clock synthesizer.

25. The apparatus of claim 23, further comprising a clock measurement packet encoder configured to encode clock measurement packets with information associated with timing of the first clock signal.

26. The apparatus of claim 20, wherein the clock measurement packet decoder, the filter, and the adder consist of digital circuits.

* * * * *